US008920107B2

United States Patent
Ikeda et al.

(10) Patent No.: US 8,920,107 B2
(45) Date of Patent: Dec. 30, 2014

(54) SUBSTRATE SUPPORT APPARATUS AND VACUUM PROCESSING APPARATUS

(75) Inventors: Tadashi Ikeda, Kawasaki (JP); Gen Goshokubo, Kawasaki (JP); Hiroshi Sone, Sagamihara (JP)

(73) Assignee: Canon Anelva Corporation, Kawasaki-shi (JP)

( * ) Notice: Subject to any disclaimer, the term of this patent is extended or adjusted under 35 U.S.C. 154(b) by 784 days.

(21) Appl. No.: 13/105,246

(22) Filed: May 11, 2011

(65) Prior Publication Data
US 2011/0286826 A1 Nov. 24, 2011

(30) Foreign Application Priority Data

May 19, 2010 (JP) ................................ 2010-115160

(51) Int. Cl.
*H01L 21/677* (2006.01)
*B25J 15/00* (2006.01)
*B25J 9/04* (2006.01)
*H01L 21/673* (2006.01)

(52) U.S. Cl.
CPC ....... *H01L 21/67727* (2013.01); *B25J 15/0052* (2013.01); *B25J 9/042* (2013.01); *H01L 21/67346* (2013.01); *H01L 21/67712* (2013.01); *H01L 21/67718* (2013.01); *H01L 21/6776* (2013.01); *Y10S 414/138* (2013.01); *Y10S 414/141* (2013.01); *Y10S 414/135* (2013.01); *Y10S 901/31* (2013.01)
USPC ...................... 414/744.1; 414/744.3; 414/935; 414/938; 414/941; 294/213; 901/31

(58) Field of Classification Search
USPC ............................ 414/938, 941, 744.1, 744.5
See application file for complete search history.

(56) References Cited

U.S. PATENT DOCUMENTS

| 5,217,341 | A | * | 6/1993 | Webber et al. ................. 414/816 |
| 5,269,643 | A | * | 12/1993 | Kodama et al. ........... 414/416.02 |
| 5,846,328 | A | | 12/1998 | Aruga et al. |
| 5,980,195 | A | * | 11/1999 | Miyashita ..................... 414/783 |
| 6,319,373 | B2 | | 11/2001 | Takeyama et al. |
| 6,634,847 | B1 | * | 10/2003 | Yeom ........................ 414/416.08 |
| 7,654,596 | B2 | * | 2/2010 | Mantz ......................... 294/103.1 |
| 7,918,488 | B2 | * | 4/2011 | Shiraishi et al. ........... 294/103.1 |
| 2011/0287177 | A1 | | 11/2011 | Yamada et al. |

FOREIGN PATENT DOCUMENTS

| JP | 8-161745 A | 6/1996 |
| JP | 8-274142 A | 10/1996 |
| JP | 2000-236010 A | 8/2000 |
| JP | 2001-210695 A | 8/2001 |

OTHER PUBLICATIONS

Office Action issued in Japanese Patent Application No. 2010-115160, dated Mar. 4, 2014 (3 pgs).

* cited by examiner

*Primary Examiner* — Scott Lowe
(74) *Attorney, Agent, or Firm* — Fitzpatrick, Cella, Harper & Scinto (57) ABSTRACT

A substrate support apparatus which can support a substrate having a center hole, comprises a support portion which can support the substrate. The support portion includes a support groove with a cross-sectional shape in which a groove width gradually increases in a counter-gravitational direction, and a width of the support groove between two end portions is larger than a width of the support groove at the center thereof.

6 Claims, 7 Drawing Sheets

THICKNESS
DIRECTION

FIG. 10

CIRCUMFERENTIAL
DIRECTION

SUBSTRATE SUPPORT APPARATUS AND VACUUM PROCESSING APPARATUS

BACKGROUND OF THE INVENTION

1. Field of the Invention

The present invention relates to a substrate support apparatus and a vacuum processing apparatus that has the substrate support apparatus. The present invention more particularly relates to a substrate support apparatus which can support a substrate having a center hole formed in it in a vacuum processing apparatus which performs a predetermined process on the substrate surface, and a vacuum processing apparatus having the substrate support apparatus.

2. Description of the Related Art

A robot has conventionally been employed to perform an operation in which a substrate is picked up before a deposition process from a substrate storage unit and placed on a carrier, or removing the substrate having undergone the predetermined deposition process from the carrier and storing it in the substrate storage unit.

An articulated robot is often used as a robot which performs this operation. An example is a robot which includes a first arm and second arm which are controlled to be driven via a driving unit and a driving belt, and in which the second arm includes an adapter at its distal end. This adapter is provided with end effectors (substrate support apparatus) which have various shapes and can hold substrates (see Japanese Patent Laid-Open Nos. 8-274142 and 2001-210695).

Support blocks (pickup members) for reliably attaching/detaching substrates are mounted on the end effectors of the robots described in Japanese Patent Laid-Open Nos. 8-274142 and 2001-210695 (see Japanese Patent Laid-Open No. 2000-236010). The support block described in Japanese Patent Laid-Open No. 2000-236010 includes a V-shaped groove which locks the center hole in the substrate, and the substrate's inner periphery defining the center hole is inserted into this V-shaped groove, thereby achieving stable substrate transportation and an improvement in throughput.

Figure 9:
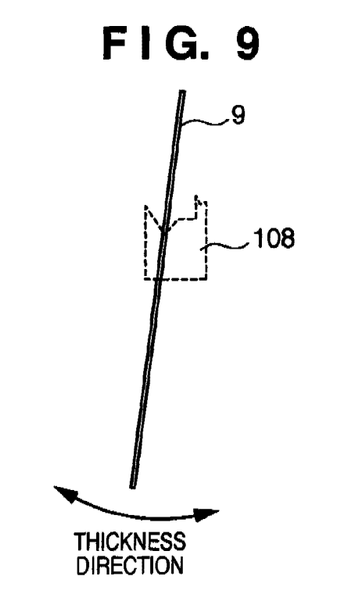
FIG. 9 is a view for explaining the situation in which a substrate tilts due to a swing in the thickness direction on a conventional support block.
Figure 10:
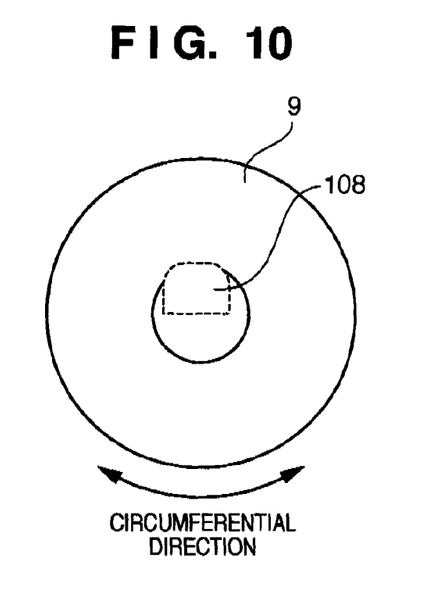
FIG. 10 is a view for explaining the situation in which the substrate performs a pendulum motion due to a swing in the circumferential direction on the conventional support block.

Unfortunately, even when the support block disclosed in Japanese Patent Laid-Open No. 2000-236010 is used, the substrate swings upon speeding up the operation of a substrate transport apparatus, so it may become difficult to stably support the substrate. For example, as shown in FIG. 9, a substrate 9 may tilt on a support block 108 due to a swing in the thickness direction. Furthermore, as shown in FIG. 10, the substrate 9 may perform a pendulum motion due to a swing in the circumferential direction, the V-shaped groove in the support block 108 may be cut away, and the substrate may get stuck between the end portions of the V-shaped groove. Due to these abnormalities in substrate support orientation, the outer periphery of the substrate and a substrate holder may come into contact with each other during a substrate transfer operation, or the lower edge of the outer periphery of the substrate may fall from the substrate holder, resulting in a failure in substrate transfer.

SUMMARY OF THE INVENTION

The present invention provides a technique that is advantageous in stably transporting a substrate.

According to another aspect, the present invention provides a technique advantageous to improve the speed at which a substrate is mounted on a carrier or that at which the substrate is recovered from the carrier, thus achieving a higher throughput.

According to one aspect of the present invention, there is provided a substrate support apparatus which can support a substrate having a center hole, comprising: a support portion which can support the substrate, wherein the support portion includes a support groove with a cross-sectional shape in which a groove width gradually increases in a counter-gravitational direction, and a width of the support groove between two end portions is larger than a width of the support groove at the center thereof.

According to another aspect of the present invention, there is provided a vacuum processing apparatus comprising the above-mentioned substrate support apparatus.

According to the present invention, because the substrate support orientation stabilizes during substrate transfer, it is possible to stably support a substrate.

Because stable substrate transfer can be done, it is possible to improve the speed at which a substrate is mounted on a carrier or that at which the substrate is recovered from the carrier, thus achieving a higher throughput.

Further features of the present invention will become apparent from the following description of exemplary embodiments with reference to the attached drawings.

DESCRIPTION OF THE EMBODIMENTS

An embodiment of the present invention will be described below with reference to the accompanying drawings. Note that members, arrangements, and other features to be described hereinafter merely give examples in which the present invention is embodied, and do not limit the present invention, so various modifications and changes can be made without departing from the scope of the present invention, as a matter of course.

Figure 1:
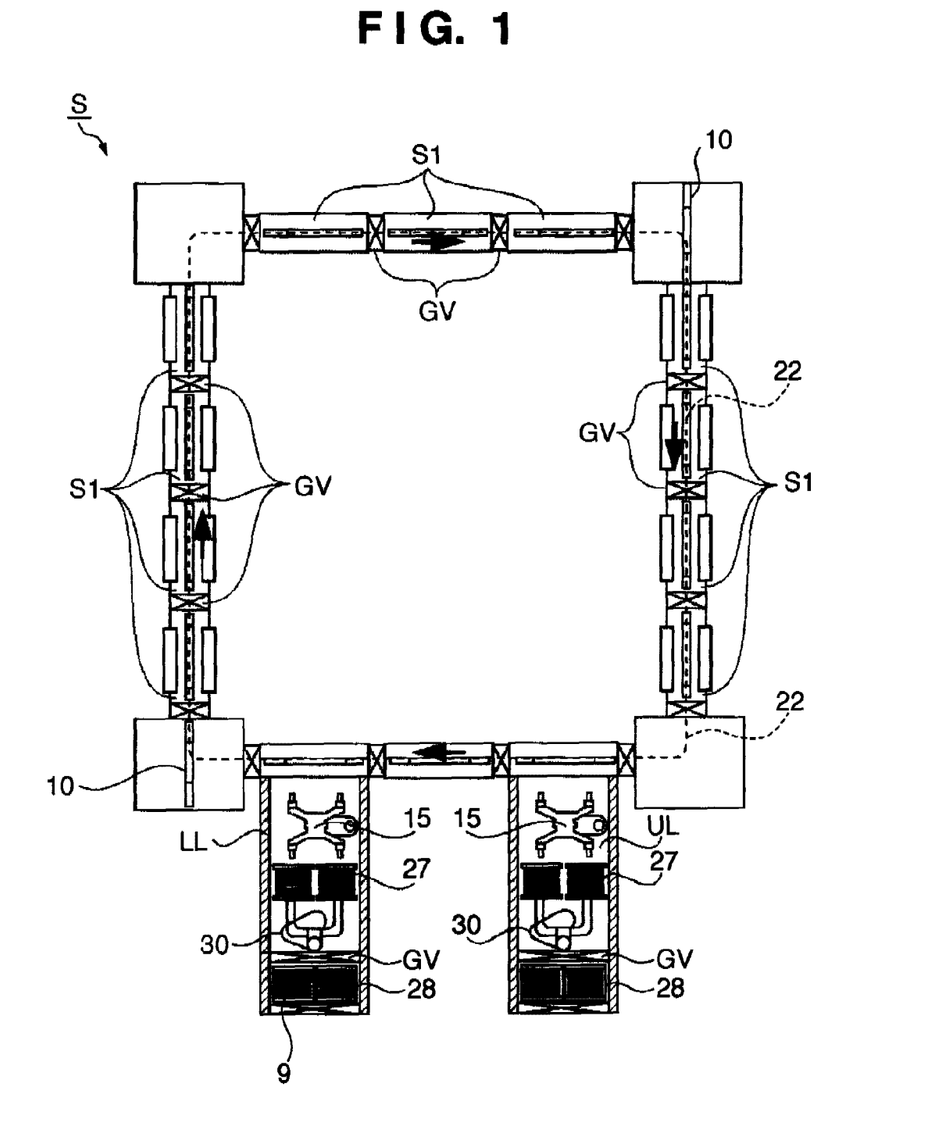
FIG. 1 is a schematic view of a vacuum processing apparatus according to an embodiment of the present invention.
Figure 2:
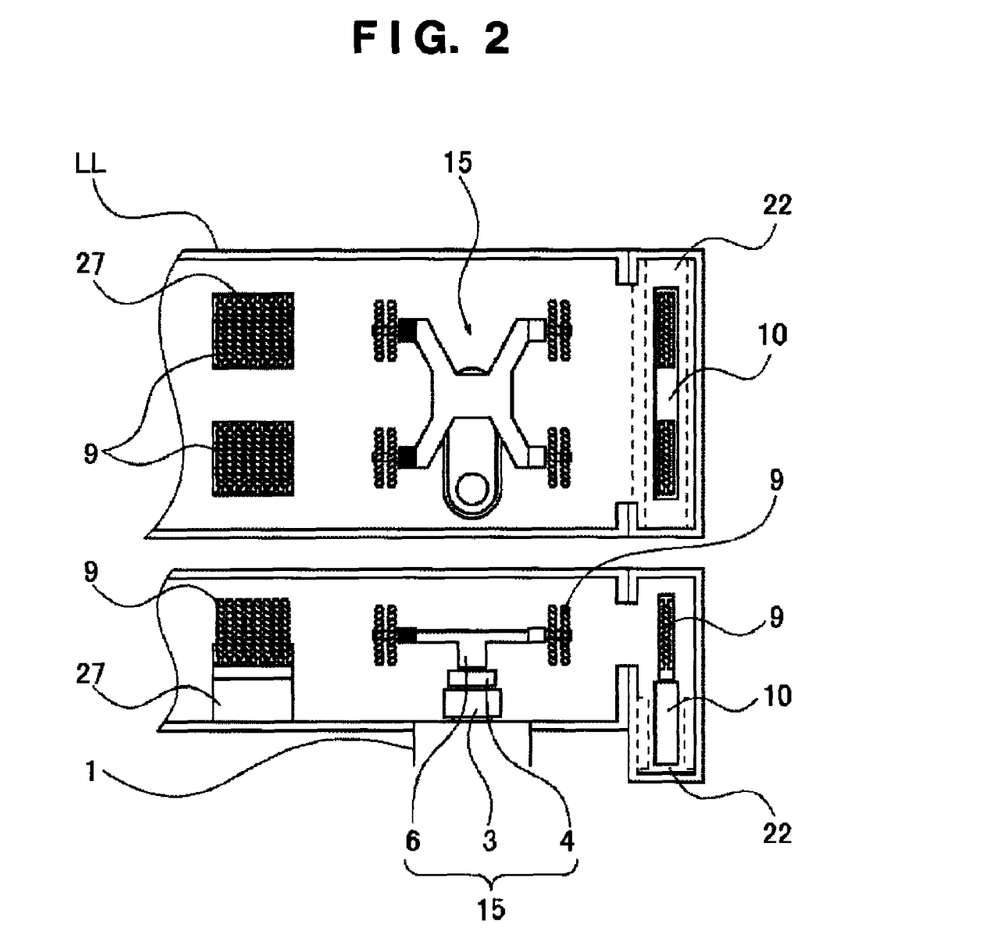
FIG. 2 shows a partial plan view and partial side view of a load chamber according to the embodiment of the present invention.
Figure 3:
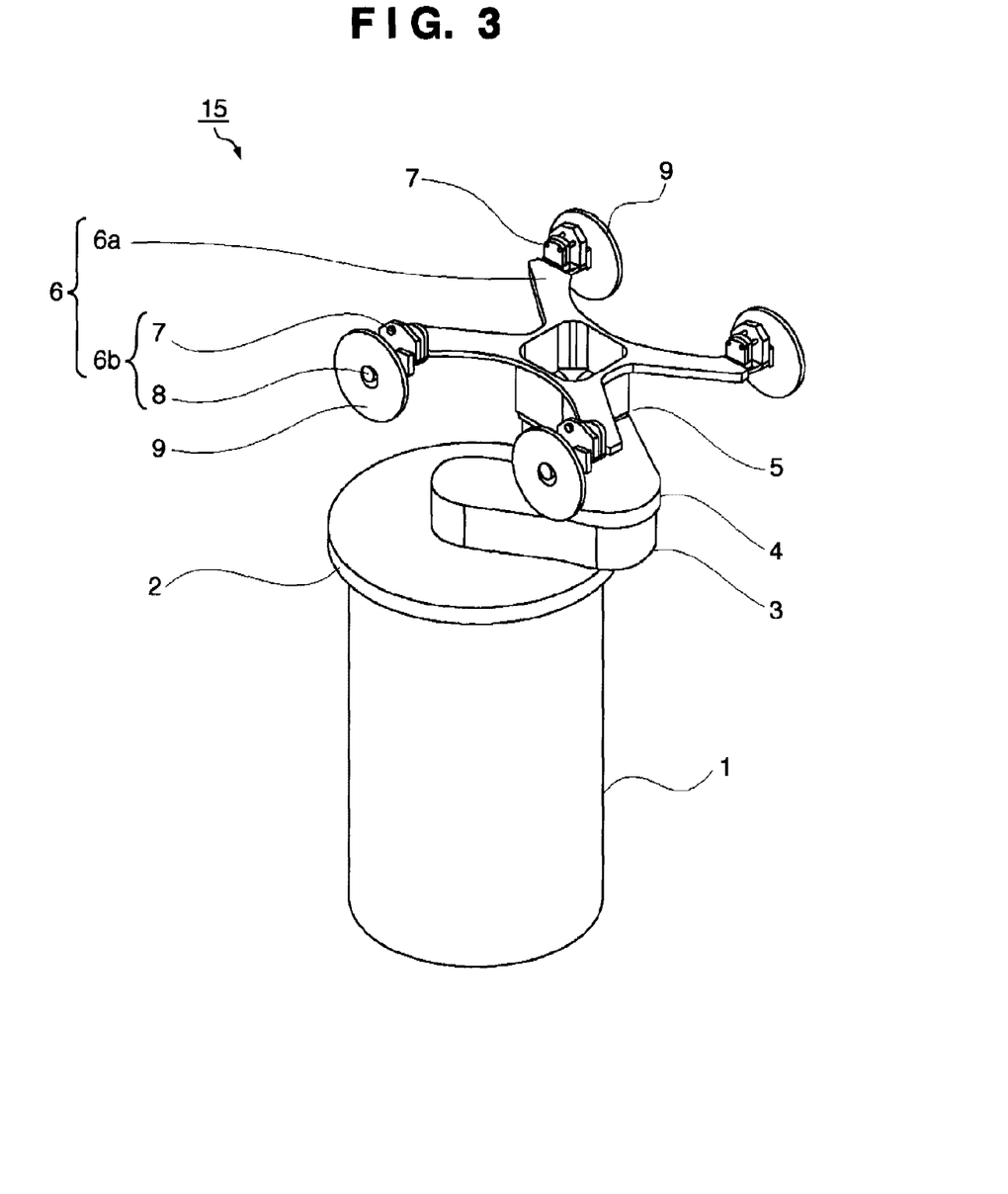
FIG. 3 is a schematic view of a robot according to the embodiment of the present invention.
Figure 4:
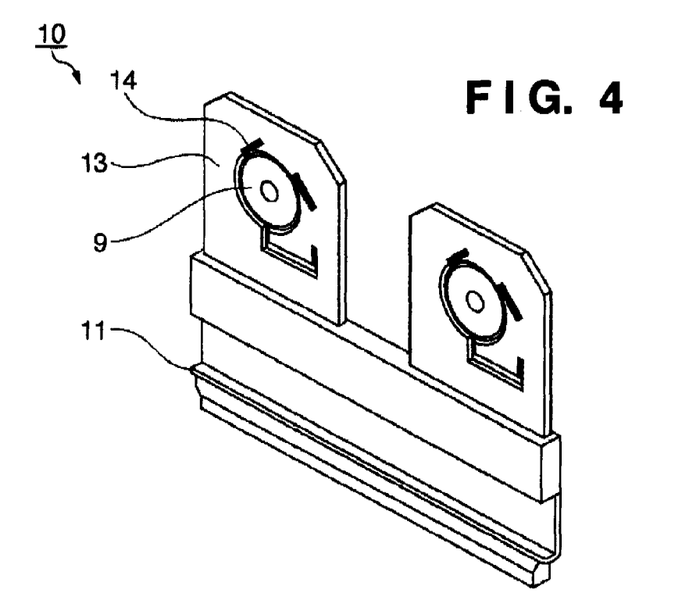
FIG. 4 is a schematic view of a carrier according to the embodiment of the present invention.
Figure 5:
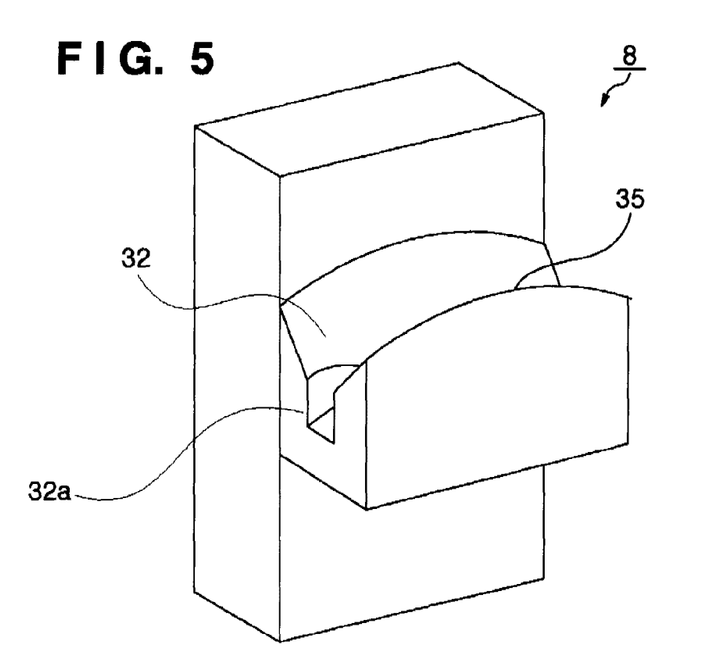
FIG. 5 is a schematic perspective view of a pickup member according to the embodiment of the present invention.

FIGS. 1 to 7B are views for explaining a vacuum processing apparatus and a substrate transport robot (to be simply referred to as a robot hereinafter) according to an embodiment of the present invention. FIG. 1 is a schematic view of the vacuum processing apparatus, FIG. 2 shows a plan view and side view of a load chamber, FIG. 3 is a schematic view of a robot, FIG. 4 is a schematic view of a carrier, FIG. 5 is a schematic perspective view of a pickup member (support block), and FIGS. 6A to 6C and 7A and 7B are plan views and sectional views of the pickup member. Note that some parts are not shown in these drawings to avoid their complications.

A vacuum processing apparatus S shown in FIG. 1 is an in-line sputtering deposition apparatus, in which a plurality of chambers which function as a load chamber LL, an unload chamber UL, deposition chambers S1, and other process chambers are connected to each other in a rectangular shape via gate valves GV. A substrate 9 is charged into the load chamber LL while being mounted in a substrate cassette 28, and is transferred into a substrate storage unit 27 by an inter-cassette transfer robot 30. The substrate 9 is further transferred onto a carrier 10 (to be described later) by a robot (substrate transport robot) 15. The substrate 9 mounted on the carrier 10 is then transported along a substrate transport path 22 which runs through the chambers, and undergoes a predetermined process in each chamber.

The substrate 9 in this embodiment is preferably a disk-like member used for a storage medium such as a magnetic disk or an optical disk. However, glass substrates, metal substrates made of, for example, aluminum or an aluminum alloy, silicon substrates, or resin substrates, all with various shapes, can also be used as long as the substrate 9 has a portion which can be locked by the pickup member, such as a center hole 9a. Note that the load chamber LL and unload chamber UL will be collectively referred to as a substrate transfer chamber hereinafter.

The robot (substrate transport robot) 15 is widely applicable as a substrate transfer apparatus provided in a sputtering deposition apparatus and a vacuum processing apparatus which performs thin film formation using, for example, an electron beam, surface modification, dry etching, or other vacuum processes. An example (vacuum processing apparatus S) in which the robot 15 is applied to an in-line sputtering deposition apparatus will be described in this embodiment.

FIG. 2 shows a plan view and side view of the load chamber LL according to the embodiment of the present invention. The robot 15 is provided at the position between the substrate transport path 22 and substrate storage unit 27 in the load chamber LL. The carrier 10 is a member which moves along the substrate transport path 22 while mounting the substrate 9, and is controlled to stop at a predetermined position (substrate transfer position) in the load chamber LL during an operation of transferring the substrate 9. The substrate storage unit 27 which separately stores a substrate 9 before deposition is provided in the load chamber LL. The substrate 9 stored in the substrate storage unit 27 is transferred onto the carrier 10 by the operation of the robot 15 provided in the load chamber LL.

Note that the unload chamber UL has nearly the same arrangement as the load chamber LL. The processed substrate 9 mounted on the carrier 10 is stored in a substrate storage unit 27 by the operation of a robot 15 provided in the unload chamber UL, is mounted in a substrate cassette 28 by an inter-cassette transfer robot 30, and is thereupon unloaded from the unload chamber UL, together with the substrate cassette 28. The substrate storage unit 27 can store 25 substrates 9 to be aligned on each of two lines, and the substrate cassette 28 can store 25 or 50 substrates 9 to be aligned on each of two lines.

FIG. 3 is a schematic view of the robot. The robot 15 is an articulated robot, in which a robot body 1 serving as a driving mechanism is provided with a first arm 3 and second arm 4. The first arm 3 includes a driving belt which transmits a rotational force from the driving mechanism. The second arm 4 has nearly the same mechanism as the first arm 3. The robot body 1 includes an internal driving source for rotating and vertically moving the first arm 3 and second arm 4, and a connecting flange 2 for installing the robot body 1 in the chamber. The second arm 4 is provided with an adapter 5 for connecting an end effector 6 serving as a substrate support apparatus to it. Locking mechanisms 6b are attached to the distal ends of the end effector 6, as will be described later.

The driving force of the robot body 1 is transmitted to the end effector 6 via the first arm 3, the second arm 4, and the driving belt built into these arms. By controlling the angles of the first arm 3 and second arm 4, the end effector 6 attached to the second arm 4 can perform a rectilinear moving operation (forward or backward moving operation) and a rotation operation. The end effector 6 can also perform a vertical moving operation (lifting or lowering operation) with respect to the connecting flange 2 by means of a vertical driving mechanism of the robot body 1. The first arm 3 is capable of vertical movement, so the second arm 4, the end effector 6, and other members which are mounted on the first arm 3 can vertically move with movement of the first arm 3. Note that the end effector 6 is capable of a pivoting motion with respect to the second arm 4.

The end effector 6 includes an arm member 6a connected to the adapter 5, and the locking mechanisms 6b each of which is attached at the position of the distal end of the arm member 6a and supports the substrate 9. The locking mechanism 6b includes, as main members, a pickup member (support block) 8 which functions as a support portion for mounting the substrate 9, and a pick connecting block 7 for connecting the pickup member 8 to the end effector 6. The pickup member 8 may be directly connected to the end effector 6, instead of using the pick connecting block 7. The pickup member 8 will be described later (see FIGS. 5 to 8).

The pick connecting block 7 and pickup member 8 of the end effector 6 are connected to the distal end of each of four extending portions which constitute the arm member 6a formed in an almost X shape when viewed from the vertical direction (Z-axis direction). Each pickup member 8 can support one substrate 9. The end effector 6 can support a maximum total of four substrates 9 at once. Among the pickup members 8 connected to the arm member 6a, two pickup members 8 can support the substrates 9 to face one direction (first direction), and the remaining two pickup members 8 can support the substrates 9 to face a direction (second direction) opposite to the first direction. By forming the arm member 6a in an X shape, the weight of the end effector 6 can be reduced as compared with that having an arm member 6a formed in an H shape.

FIG. 4 is a schematic view of the carrier 10. The carrier 10 includes a slider 11 having a mechanism portion for receiving a driving force from the side of the substrate transport path 22, and holders (substrate holders) 13 each of which is provided with substrate support grippers 14 for supporting the substrate 9. The holders 13 are formed on the slider 11. The substrate support gripper 14 is an elastic member and can be formed from, for example, a bent leaf spring. The carrier 10 used in this embodiment includes two holders 13, so it can mount two substrates 9 at once. Note that the shape of the carrier 10 can be changed in accordance with that of the slider 11, and the substrate support grippers 14 for supporting the substrate 9 can also be changed as needed.

Mounting of the substrate 9 on the carrier 10 (transfer operation) is performed by placing the substrate 9, mounted on the pickup member 8 by the operation of the robot 15, at the substrate support position of the holder 13. More specifically, an operation of bending outward one of the substrate support grippers 14 of the holder 13, placing the substrate 9, supported by the pickup members 8, at the substrate support position of the holder 13 by the robot 15, and canceling the outward bending of the substrate support gripper 14 of the holder 13 is performed. The unload chamber UL can have the same internal arrangement as the load chamber LL. In this case, the robot 15 performs an operation reverse to that performed in the load chamber LL.

With the above-mentioned operation of the robot 15 using the end effector 6 with an X shape, a substrate transfer operation can be quickly performed when the end effector 6 repeats its pivoting in transferring the substrate 9 from the substrate storage unit 27 onto the carrier 10. Note that the robot 15 can also operate the pickup member 8 in a direction (forward/backward moving direction) closer to or away from the carrier 10 and the gravitational or counter-gravitational direction (vertical direction) via, for example, the driving source, the first arm 3, the second arm 4, and the end effector 6a, as described above.

The detailed arrangement of the pickup member 8 will be described with reference to FIGS. 5 to 7A and 7B. FIG. 5 is a perspective view of the pickup member 8. The pickup member 8 has a support groove 32 whose cross-sectional shape is a V shape (having a V-shaped cross-section), and can support the substrate 9 by mounting, in the support groove 32, the upper portion of the inner periphery of the substrate 9, that defines a center hole 9a. While the substrate 9 is supported in the support groove 32, since the center of gravity of the substrate 9 is located within the width of the support groove 32, so the substrate 9 can be reliably supported. Note that a groove having a V-shaped cross-section means herein a groove with a shape in which the groove width gradually increases in the upward direction (counter-gravitational direction). A groove having a V-shaped cross-section also includes a groove having a curved surface with a predetermined curvature radius.

Figure 6A:
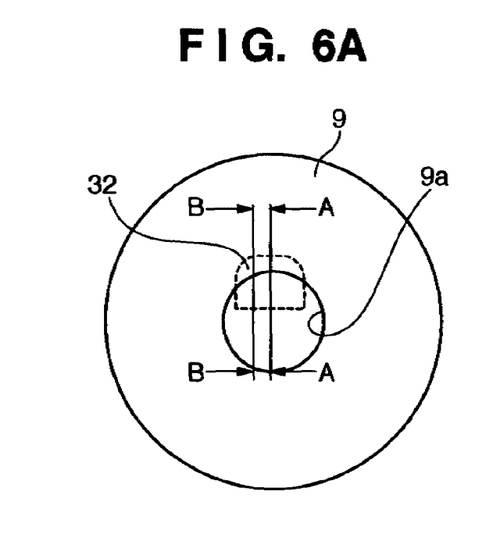
FIGS. 6A to 6C are a plan view and sectional views of the pickup member according to the embodiment of the present invention.
Figure 6B:
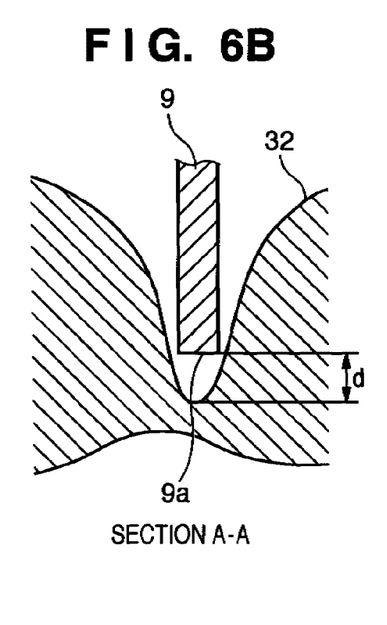
Figure 6C:
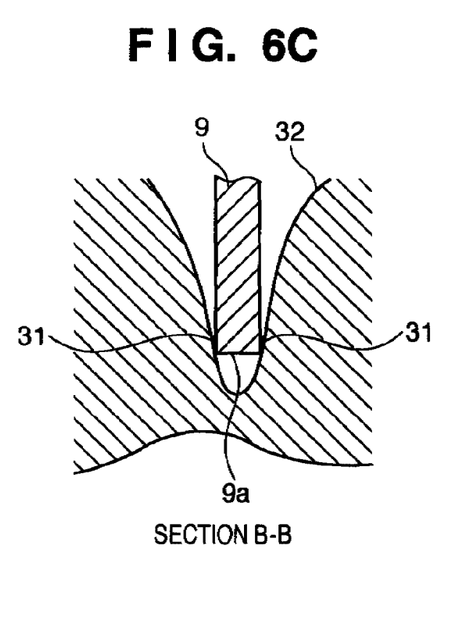
Figure 7A:
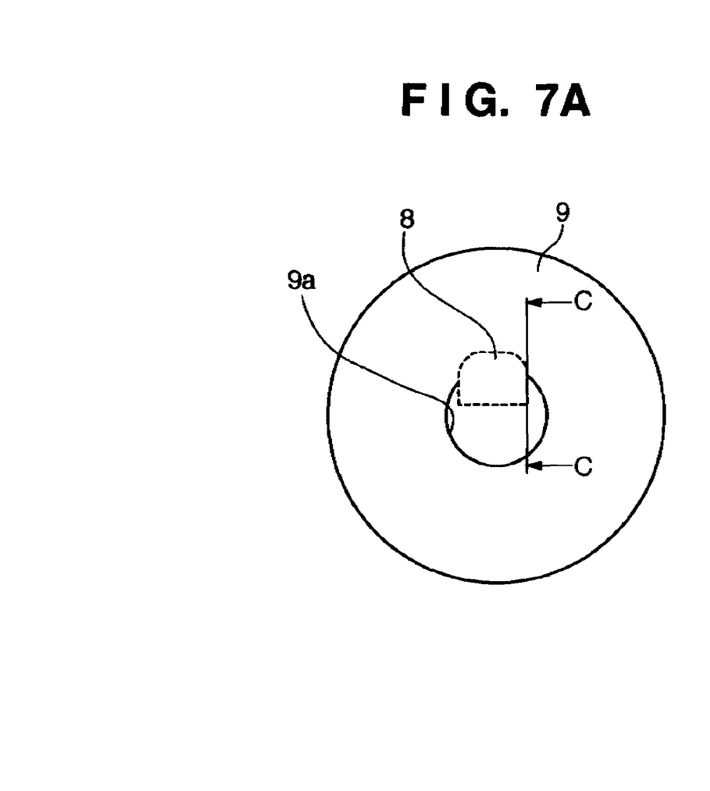
FIGS. 7A and 7B are a plan view and sectional view of the pickup member according to the embodiment of the present invention.
Figure 7B:
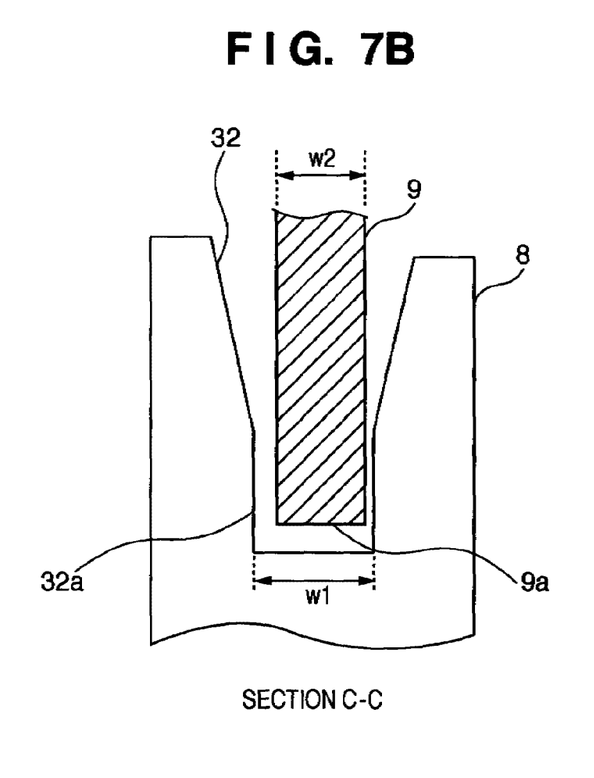

FIGS. 6A to 6C and 7A and 7B show the state in which the substrate 9 is supported by the support groove 32. FIG. 6B shows a section A-A in FIG. 6A, and FIG. 6C shows a section B-B in FIG. 6A. FIG. 7B shows a section C-C in FIG. 7A. Note that the support groove 32 has a bilaterally symmetrical shape having the line A-A as a center, and is formed in an arc which is convex upward. An arc 35 of the support groove 32 is formed to have a radius larger than that of the center hole 9a in the substrate 9. Therefore, because the inner periphery of the substrate 9 defining the center hole 9a and the pickup member 8 are in contact with each other at three or more points, it is possible to suppress a pendulum motion of the substrate 9 supported on the pickup member 8.

FIG. 6B shows the section A-A of the support groove 32 in the pickup member 8, and shows the state in which the substrate 9 is supported by the support groove 32 in the pickup member 8. The inner periphery of the substrate 9 defining the center hole 9a and the bottom of the support groove 32 have a predetermined gap d formed between them. Both the two surfaces of the inner periphery of the substrate 9 defining the center hole 9a do not come into contact with the right and left wall surfaces of the support groove 32 while the substrate 9 is supported by the pickup member 8.

Controlling the gap d makes it possible to suppress a swing of the substrate 9 in the thickness direction. The cross-sectional shape of the support groove 32 is preferably optimized so that the gap d becomes 0.5 mm or less. However, if the substrate 9 swings, it is possible to suppress an increase in strength of a swing of the substrate 9 as the center hole 9a and support groove 32 come into contact with each other on the line A-A.

FIG. 6C shows the section B-B of the support groove 32 in the pickup member 8, and shows the state in which the substrate 9 is supported by the support groove 32 in the pickup member 8. The two surfaces of the inner periphery of the substrate 9 defining the center hole 9a come into contact with two portions on the right and left wall surfaces (contact points 31) of the support groove 32, thereby supporting the self weight of the substrate 9 at the contact points 31. Because the support groove 32 has a bilaterally symmetrical shape having the line A-A as a center, the two surfaces of the inner periphery of the substrate 9 defining the center hole 9a are in contact with two portions on the right and left wall surfaces of the support groove 32 on the opposite side assuming the line A-A as a center. That is, by optimizing the cross-sectional shape of the support groove 32 in the pickup member 8, the substrate 9 is supported upon coming into contact with the support groove 32 at the four contact points 31. By supporting the substrate 9 on both sides with respect to the line A-A (center line), it is possible to suppress a swing of the substrate 9 in the circumferential direction (see FIG. 10).

FIG. 7B shows the section C-C of the support groove 32 in the pickup member 8, and shows the state in which the substrate 9 is supported by the support groove 32 in the pickup member 8. Parts (two end portions 32a) of the support groove 32 are formed in a rectangular shape so as to prevent the inner periphery of the substrate 9 defining the center hole 9a from coming into contact with the support groove 32. This rectangular shape is formed to have a width W1 larger than a width W2 of the substrate 9. The section C-C corresponds to the two end portions 32a of the support groove 32, and this shape prevents the support groove 32 from coming into contact with the inner periphery of the substrate 9 defining the center hole 9a upon supporting the substrate 9 in the support groove 32. This makes it possible to prevent the inner periphery of the substrate 9 defining the center hole 9a and the two ends of the support groove 32 from being cut away, and the substrate 9 from getting stuck in the support groove 32 as the substrate 9 performs a pendulum motion in the circumferential direction (see FIG. 10). That is, by forming the two end portions 32a of the support groove 32 such that the width of the support groove 32 exceeds the thickness of the substrate 9, it is possible to prevent the two end portions 32a of the support groove 32 and the inner periphery of the substrate 9 defining the center hole 9a from coming into slide contact with each other, and the substrate 9 from getting stuck in the support groove 32.

Figure 8:
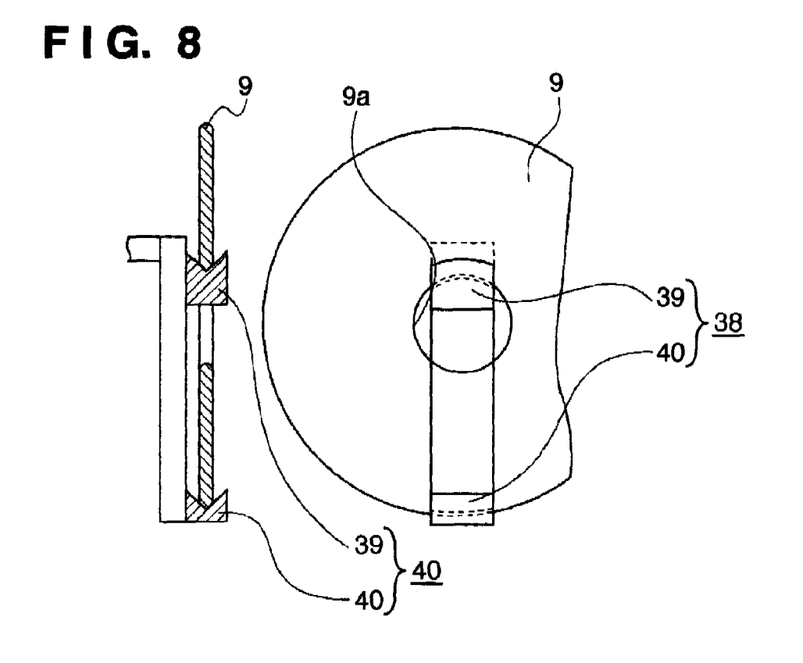
FIG. 8 is a view illustrating another example of the arrangement of the pickup member according to the embodiment of the present invention.

FIG. 8 illustrates another example of the arrangement of the pickup member. A pickup member 38 shown in FIG. 8 includes a first pickup member (first support block) 39 which supports the upper portion of the center hole 9a, and a second pickup member (second support block) 40 which can lock the lower edge of the outer periphery of the substrate 9. The first pickup member (first support block) 39 has the arrangement of the support groove 32 shown in FIGS. 5 to 7A and 7B described earlier. When the substrate 9 swings in the thickness direction, it does so using the support portion (first pickup member 39) for the upper portion of the center hole 9a as a fulcrum. In this case, therefore, by adding the second pickup member (second support block) 40, which comes into contact with the outer periphery of the substrate 9 to suppress a swing of the substrate 9, to the lower edge of the outer periphery of the substrate 9, that is far from the support portion, it is possible to effectively suppress a swing of the substrate 9 in the thickness direction (see FIG. 9).

Note that the arrangement of the end effector 6 presented above merely gives an example, so an end effector (arm member 6a) other than that with an X shape may be provided. For example, an end effector which simply includes one pickup member 8 attached on it may be provided. Also, an I-shaped end effector including one pickup member 8 attached on it to face one direction (first direction), and another pickup member 8 attached on it to face a direction (second direction) opposite to the first direction may be provided. Moreover, a pickup member which includes support grooves 32 formed to be aligned on a plurality of lines and can therefore support a plurality of substrates 9 at once may be provided.

In addition, the arrangement of the robot 15 presented above merely gives an example, so a substrate support apparatus (pickup member) according to the present invention is applicable to a known substrate rotation mechanism which changes the position at which the substrate support grippers 14 hold the substrate 9 after deposition of an underlying layer, as a matter of course. When a pickup member according to the present invention is applied to a substrate rotation mechanism, the substrate rotation mechanism is preferably formed by attaching the pickup member 8 to the distal end of a shaft which temporarily supports the substrate 9.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-115160, filed May 19, 2010, which is hereby incorporated by reference herein in its entirety.

What is claimed is:

1. A substrate support apparatus which can support a substrate having a center hole, comprising:
a support portion which can support the substrate,
wherein said support portion includes a support groove with a cross-sectional shape in which a groove width gradually increases in a counter-gravitational direction,
wherein a width of said support groove at two end portions of a longitudinal direction is larger than a width of said support groove at the center of a longitudinal direction thereof,
wherein the support groove is formed in an arc which is convex in the counter-gravitational direction, and a curvature radius of the arc is larger than a curvature radius of the center hole in the substrate, and
wherein both wall surfaces of the support groove are configured to contact the substrate at four positions located between the center of the longitudinal direction of the support groove and the two end portions of the longitudinal direction of the support groove.

2. The apparatus according to claim 1, wherein said support portion includes a first support block including said support groove, and a second support block which can lock the substrate on an outer periphery of the substrate.

3. The apparatus according to claim 1, further comprising a driving source which operates said support portion in a forward/backward moving direction, a rotation direction, and a vertical direction.

4. The apparatus according to claim 1, wherein said support groove in said support portion supports the substrate upon coming into contact with an inner periphery of the substrate defining the center hole.

5. A vacuum processing apparatus comprising a substrate support apparatus defined in claim 1.

6. The apparatus according to claim 1, wherein said both wall surfaces of the support groove are configured not to contact the substrate at a center position of the longitudinal direction of the support groove.

\* \* \* \* \*